(12) United States Patent
Abou-Khalil et al.

(10) Patent No.: US 8,642,452 B2
(45) Date of Patent: Feb. 4, 2014

(54) SEMICONDUCTOR-ON-INSULATOR DEVICE WITH ASYMMETRIC STRUCTURE

(75) Inventors: Michel J. Abou-Khalil, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 13/012,137

(22) Filed: Jan. 24, 2011

(65) Prior Publication Data

US 2012/0187525 A1    Jul. 26, 2012

(51) Int. Cl.
  *H01L 21/36*      (2006.01)
(52) U.S. Cl.
  USPC ..... 438/479; 257/507; 257/510; 257/E21.461
(58) Field of Classification Search
  USPC .......................................... 257/509; 438/479
  See application file for complete search history.

(56) References Cited

U.S. PATENT DOCUMENTS

| | | | |
|---|---|---|---|
| 5,773,326 A | 6/1998 | Gilbert et al. | |
| 6,096,584 A | 8/2000 | Ellis-Monaghan et al. | |
| 6,121,661 A | 9/2000 | Assaderaghi et al. | |
| 6,180,487 B1 | 1/2001 | Lin | |
| 6,452,234 B1 | 9/2002 | Mahanpour | |
| 6,462,381 B1 | 10/2002 | Beebe et al. | |
| 6,483,147 B1 | 11/2002 | Lin | |
| 6,589,823 B1 | 7/2003 | Beebe et al. | |
| 6,909,148 B2 | 6/2005 | Yamazaki et al. | |
| 2005/0212051 A1* | 9/2005 | Jozwiak et al. | 257/355 |
| 2006/0118872 A1 | 6/2006 | Kato | |
| 2008/0092094 A1 | 4/2008 | Coolbaugh et al. | |
| 2009/0173985 A1 | 7/2009 | Lee et al. | |
| 2010/0248432 A1 | 9/2010 | Johnson et al. | |

OTHER PUBLICATIONS

U.S. Patent and Trademark Office, International Search Report and Written Opinion issued in related International application No. PCT/US2012/021942 dated May 10, 2012.

* cited by examiner

*Primary Examiner* — Ha Tran T Nguyen
*Assistant Examiner* — Raj R Gupta
(74) *Attorney, Agent, or Firm* — Wood, Herron & Evans LLP; Anthony J. Canale

(57) ABSTRACT

Device structures with a reduced junction area in an SOI process, methods of making the device structures, and design structures for a lateral diode. The device structure includes one or more dielectric regions, such as STI regions, positioned in the device region and intersecting the p-n junction between an anode and cathode. The dielectric regions, which may be formed using shallow trench isolation techniques, function to reduce the width of a p-n junction with respect to the width area of the cathode at a location spaced laterally from the p-n junction and the anode. The width difference and presence of the dielectric regions creates an asymmetrical diode structure. The volume of the device region occupied by the dielectric regions is minimized to preserve the volume of the cathode and anode.

20 Claims, 12 Drawing Sheets

SEMICONDUCTOR-ON-INSULATOR DEVICE WITH ASYMMETRIC STRUCTURE

BACKGROUND

The present invention relates generally to semiconductor device fabrication and, more particularly, to device structures formed in the active layer of a silicon-on-insulator (SOI) substrate, methods of fabricating SOI device structures, and design structures for an integrated circuit including the SOI device structures.

To remain competitive with increased demands for computer processing power, semiconductor devices must constantly offer the ability to handle higher frequency signals with lower power consumption. To provide these performance increases, designers have been shrinking device dimensions, pushing the minimum feature size limitations of available semiconductor fabrication technologies. Silicon-on-insulator (SOI) technology has been developed to allow continued reductions in device size beyond what is possible with standard CMOS. Generally, a SOI wafer includes a top layer of thin SOI semiconductor material (e.g., silicon), a bulk substrate (e.g., a bulk silicon substrate or a silicon epilayer on a bulk silicon substrate), and a thin buried insulator layer, such as a buried oxide or BOX layer, physically separating and electrically isolating the SOI layer from the bulk substrate. The improved isolation and thinner active semiconductor regions provided by SOI allow devices to be formed with smaller dimensions, resulting in certain performance improvements over standard bulk semiconductor CMOS transistors, including higher speed switching and reduced power consumption at equivalent performance.

Semiconductor chips are regularly exposed to electrostatic discharge (ESD) events leading to potentially large and damaging currents within the integrated circuit. As semiconductor devices shrink, they become more susceptible to damage by ESD events. To prevent ESD damage, manufacturers of integrated circuits must take precautions to suppress ESD by including suppression devices on input and output pins. An effective ESD suppression device must be able to conduct large ESD currents safely away from sensitive devices without sustaining damage and, to avoid harming the performance of the protected circuit, must also avoid adding significantly to the capacitive loading of the input or output pin.

There is a need for improved device structures with designs that optimize device metrics such as failure current, junction capacitance, and on resistance, as well as methods of making these improved device structures and design structures for an integrated circuit including the improved device structure and fabricated using an SOI substrate.

BRIEF SUMMARY

In an embodiment of the invention, a method is provided for fabricating a device structure in a semiconductor layer of a semiconductor-on-insulator (SOI) substrate. The method includes forming a cathode including a first region of a first conductivity type and a first width in the semiconductor layer and forming an anode including a first region of a second conductivity type in the semiconductor layer. The anode is arranged relative to the cathode so that the first region of the anode is coextensive with the first region of the cathode along a p-n junction. The p-n junction has a second width measured in a direction parallel to the first width. The second width of the p-n junction is shorter than the first width of the first region measured at a location spaced laterally from the p-n junction.

In an embodiment of the invention, a device structure is provided that is fabricated in a semiconductor layer of a semiconductor-on-insulator (SOI) substrate. The device structure includes a cathode including a first region of the semiconductor layer doped with a first conductivity type and a first width in the semiconductor layer. The device structure further includes an anode including a first region of a second conductivity type in the semiconductor layer. The anode is arranged relative to the cathode so that the first region of the anode is coextensive with the first region of the cathode along a p-n junction. The p-n junction has a second width measured in a direction parallel to the first width. The second width of the p-n junction is shorter than the first width of the first region measured at a location spaced laterally from the p-n junction.

In another embodiment, a hardware description language (HDL) design structure is encoded on a machine-readable data storage medium. The HDL design structure comprises elements that, when processed in a computer-aided design system, generates a machine-executable representation of a device structure fabricated in a semiconductor layer of a semiconductor-on-insulator (SOI) substrate. The HDL design structure includes a cathode including a first region of the semiconductor layer doped with a first conductivity type and a first width in the semiconductor layer. The HDL design structure further includes an anode including a first region of a second conductivity type in the semiconductor layer. The anode is arranged relative to the cathode so that the first region of the anode is coextensive with the first region of the cathode along a p-n junction. The p-n junction has a second width measured in a direction parallel to the first width. The second width of the p-n junction is shorter than the first width of the first region measured at a location spaced laterally from the p-n junction. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Embodiments of the invention generally provide horizontal diode structures formed using standard CMOS fabrication steps for field effect transistors on a semiconductor-on-insulator (SOI) wafer. Insulating regions, in a representative form of shallow trench isolation (STI) regions, are used to laterally isolate the diode, and to displace portions of the active semiconductor layer along the intended location of the diode p-n junction. The insulating regions alter the shape and area of the diode p-n junction, and permit that the respective areas of the diode p-n junction, anode, and cathode to be adjusted independently of one other. A gate stack, which may comprise a polysilicon layer, may serve as both a self-aligning mask for the anode/cathode implantations and to block silicide formation over the p-n junction, preventing shorting between the anode and cathode regions of the device. Alternatively, a dielectric may be used to form the self-aligning mask and to block silicide formation across the p-n junction. Contacts are formed on the cathode and anode using a silicidation process. The diode may be electrically coupled to input/output (I/O) pads requiring ESD protection and the protected integrated circuit on the chip using front end of line (FEOL) and back end of line (BEOL) interconnection layers.

Figure 1:
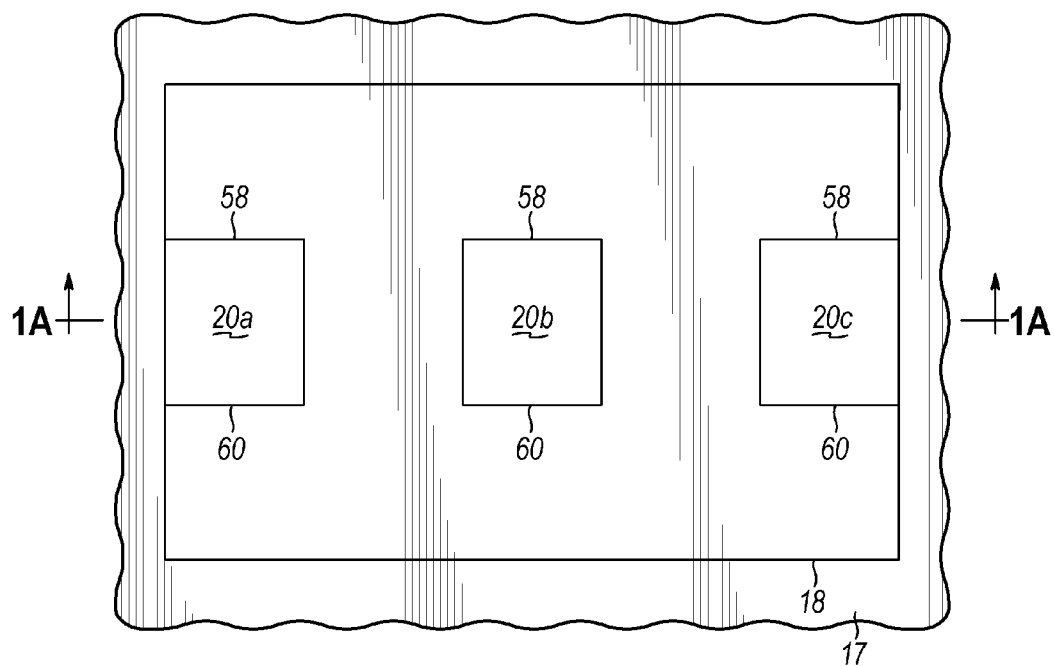
FIG. 1 is a diagrammatic top view of a portion of a substrate at an initial fabrication stage of a processing method in accordance with an embodiment of the invention.
Figure 1A:
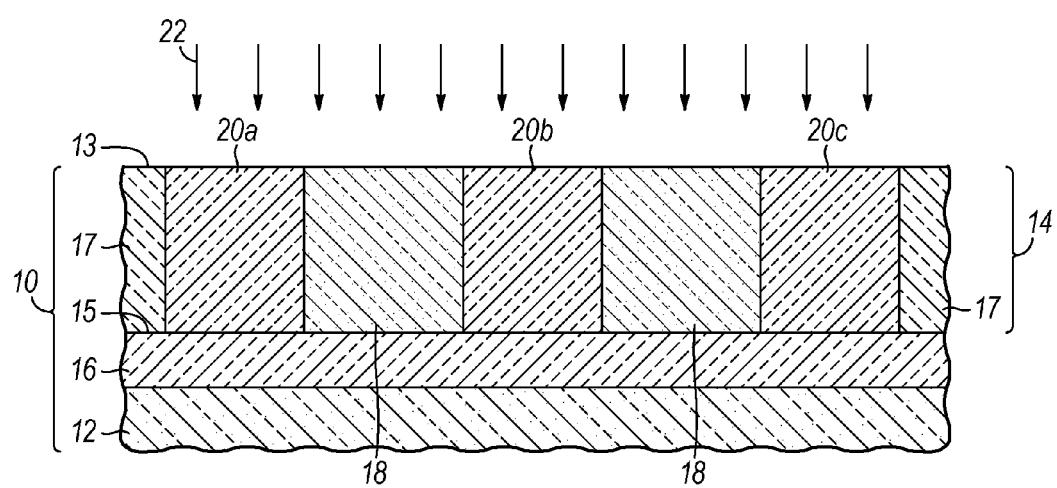
FIG. 1A is a cross-sectional view taken generally along line 1A-1A of FIG. 1.

With reference to FIGS. 1 and 1A, a semiconductor-on-insulator (SOI) substrate 10 includes a handle wafer 12, a device or SOI layer 14, and a buried dielectric layer 16 formed of an insulating material. The buried dielectric layer 16 may be a buried oxide layer containing silicon dioxide (e.g., $SiO_2$). The SOI layer 14 is separated from the handle wafer 12 by the intervening buried dielectric layer 16. The SOI layer 14 is composed of monocrystalline semiconductor material, such as single crystal silicon or another material that contains primarily silicon. The monocrystalline semiconductor material of the SOI layer 14 may contain a definite defect concentration and still be considered single crystal. The handle wafer 12 may also be constituted by a single crystal or monocrystalline semiconductor material, such as silicon, or another type of material. The buried dielectric layer 16 electrically insulates the handle wafer 12 from the SOI layer 14, which is considerably thinner than the handle wafer 12 and is in direct contact along a planar interface with a top surface 15 of the buried dielectric layer 16. The SOI substrate 10 may be fabricated by any suitable conventional technique, such as wafer bonding techniques or separation by implantation of oxygen (SIMOX) techniques, familiar to a person having ordinary skill in the art.

The SOI layer 14 has a thickness measured from a top surface 13 of SOI layer 14 to the top surface 15 of the buried dielectric layer 16. In various specific embodiments, the thickness of the SOI layer 14 may range from about 20 nanometers (nm) to about 200 nm. In an extremely thin semiconductor on insulator (ETSOI) technology, the SOI layer 14 may have a representative thickness of 20 nm or less and the buried dielectric layer 16 may have a representative thickness of 50 nm or less.

A lateral isolation structure 17 and one or more dielectric regions 20a, 20b, 20c are defined by a conventional process in the SOI layer 14. In one embodiment, the lateral isolation structure 17 and dielectric regions 20a, 20b, 20c are formed by a shallow trench isolation (STI) process that relies on a conventional lithography and etching process. The STI process may include formation of a patterned hardmask (not shown) on a top surface 13 of the SOI layer 14, followed by reactive ion etching (RIE) to form trenches and vias by etching through the SOI layer 14 to the depth of the buried dielectric layer 16. The hardmask may then be removed from the SOI layer 14 using an etching process. The trenches and vias are filled with portions of a blanket layer of a dielectric material. The dielectric material comprising the lateral isolation structure 17 and the dielectric regions 20a, 20b, 20c may be an oxide, such as densified tetraethylorthosilicate (TEOS) deposited by thermal chemical vapor deposition (CVD) or a high-density plasma (HDP) oxide deposited with plasma assistance. A polishing process, such as chemical mechanical polishing (CMP), is employed to remove excess dielectric material from the top surface 13. After planarization, the residual dielectric material disposed inside the trenches defines the lateral isolation structure 17 and the residual dielectric material disposed inside the vias define the dielectric regions 20a, 20b, 20c.

The lateral isolation structure 17 and dielectric regions 20a, 20b, 20c extend from the top surface 13 of SOI layer 14 to a top surface 15 of the buried dielectric layer 16. The lateral isolation structure 17 delineates and bounds a device region 18 (FIG. 1) of the SOI layer 14, which is electrically isolated from adjacent devices regions (not shown) defined in the SOI layer 14 by additional isolation structures (not shown). Each of the dielectric regions 20a, 20b, 20c has side edges 58, 60.

The device region 18 of the SOI layer 14 is provided with a base doping level. The doping process may include forming a patterned ion-implantation mask (not shown) on the SOI layer 14 and implanting ions, as indicated by the single-headed arrows 22, into the device region 18. The ion-implantation mask controls dopant introduction into device region 18 during implantation. The ion-implantation mask may be a resist layer having a window aligned with the device region 18 to allow implantation of ions 22 of a desired dopant. The window may be formed in the screen oxide layer using photolithographic patterning and etching processes.

The ions 22 are implanted into the entire device region 18 using selected implantation conditions (e.g., kinetic energy and dose) and may include multiple implantation conditions.

The device region 18 may be provided with an n-type base doping by implanting ions 22 of a dopant such as phosphorus (P), arsenic (As), antimony (Sb), or other suitable n-type dopant; or a p-type base doping by implanting ions 22 of a dopant such as boron (B), aluminum (Al), gallium (Ga), or any other suitable p-type dopant. After ion implantation is complete, the mask layer is removed. In a representative embodiment, the base doping may be selected such that the device region 18 contains n-type semiconductor material. The introduction of the dopant into device region 18 alters the electrical properties of the constituent semiconductor material by increasing the conductivity.

In the representative embodiment, the base doping of the device region 18 is executed after the formation of the lateral isolation structure 17 and dielectric regions 20*a*, 20*b*, 20*c*. However, in an alternative embodiment, the lateral isolation structure 17 and dielectric regions 20*a*, 20*b*, 20*c* may be formed before the device region 18 experiences the base doping process. The base doping of the device region 18 may be introduced by a channel doping operation performed during the CMOS or BiCMOS processing of field effect transistors elsewhere on the SOI substrate 10. To obtain an n-type device region 18, the device region 18 may be unmasked during PFET channel ion implantation. In a similar fashion, the device region 18 may be doped with a p-type dopant if not masked during the formation of NFET gate channels.

Figure 2:
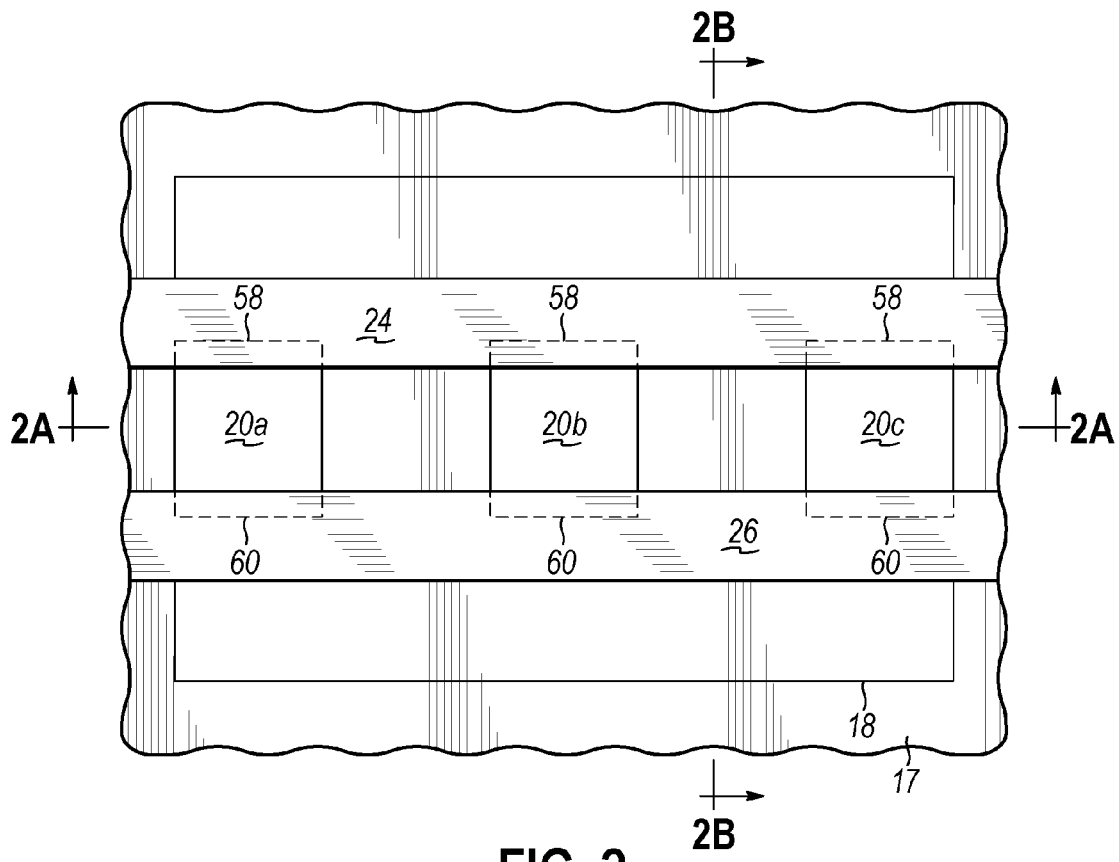
FIGS. 2 and 2A are top and cross-sectional views similar to FIGS. 1 and 1A, respectively, at a subsequent fabrication stage of the processing method.
Figure 2A:
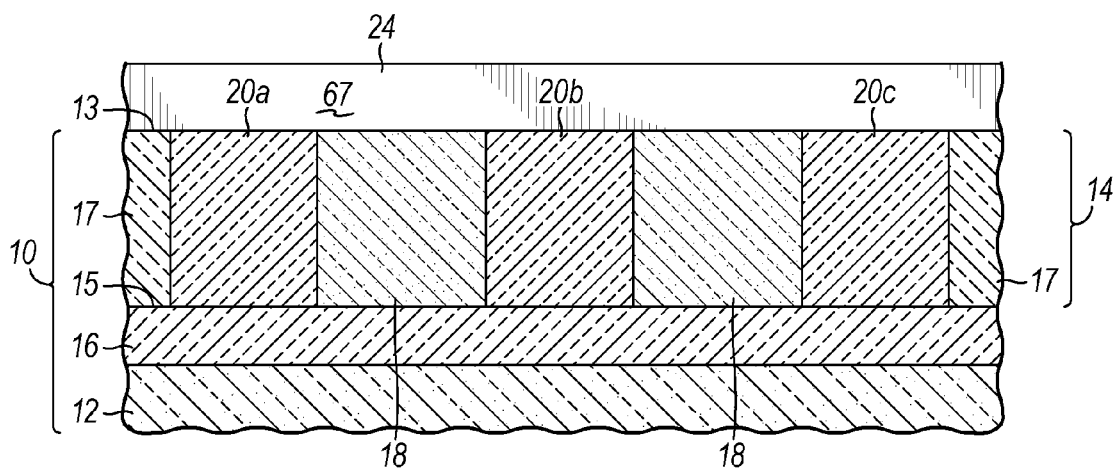
Figure 2B:
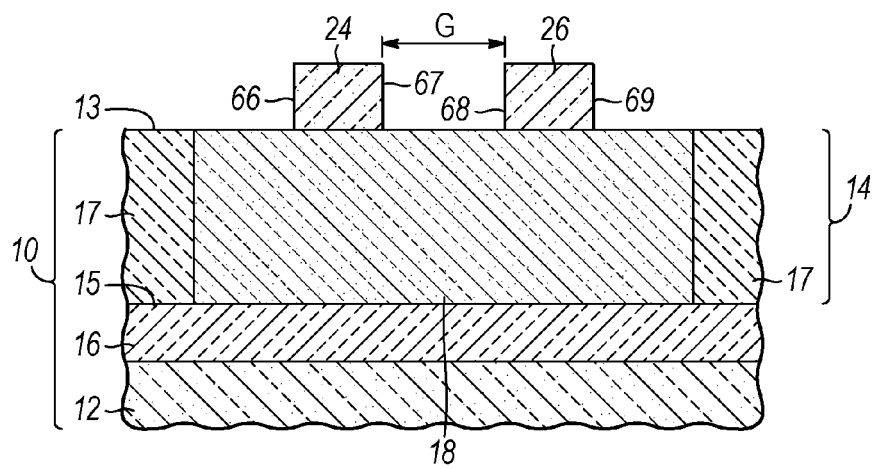
FIG. 2B is a cross-sectional view taken generally along line 2B-2B of FIG. 2.

With reference to FIGS. 2, 2A, 2B in which like reference numerals refer to like features in FIGS. 1, 1A and at a subsequent fabrication stage, mask structures 24, 26 are formed over respective portions of the device region 18 of the SOI layer 14. The mask structures 24, 26 have the representative form of strips with a parallel alignment in a first lateral direction and a spaced arrangement in a second lateral direction orthogonal to the first lateral direction. In the spaced arrangement, mask structure 24 is separated from mask structure 26 by a gap, G. The mask structures 24, 26 partially overlap dielectric regions 20*a*, 20*b*, 20*c* and subjacent strips of the device region 18.

In one embodiment, the mask structures 24 may be formed by CMOS or BiCMOS processing steps during fabrication of the CMOS gate structures. In particular, the mask structures 24 may be formed of a portion of a CMOS gate stack, such as polycrystalline silicon (polysilicon) with sidewall spacers. The mask structures 26 may be defined concurrently with the CMOS gate structures in which polysilicon is deposited using, for example, low pressure chemical vapor phase deposition (LPCVD) or physical vapor deposition (PVD) and patterned using photolithography and etching (e.g., RIE). Insulating spacers (not shown) may be optionally formed on the sidewalls of the polysilicon strips.

In an alternative embodiment of the invention, the mask structures 24 may be comprised of a dielectric material, such as $SiO_2$ or silicon nitride ($Si_3N_4$). For example, the dielectric material comprising the mask structures 24 may be formed using existing CMOS or BiCMOS processing steps, such as processing steps that deposit and pattern a thick oxide. Alternatively, the dielectric material comprising the mask structures 24 may originate from depositing and patterning a dielectric material that is independent of CMOS or BiCMOS processing.

Figure 3A:
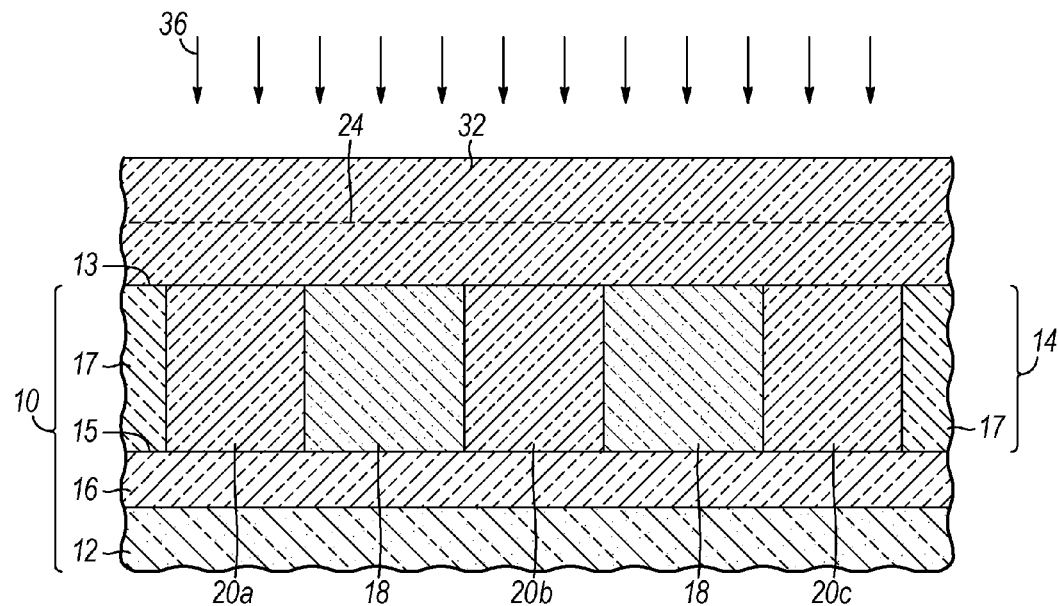
FIGS. 3A and 3B are cross-sectional views similar to FIGS. 2A and 2B, respectively, at a subsequent fabrication stage of the processing method.
Figure 3B:
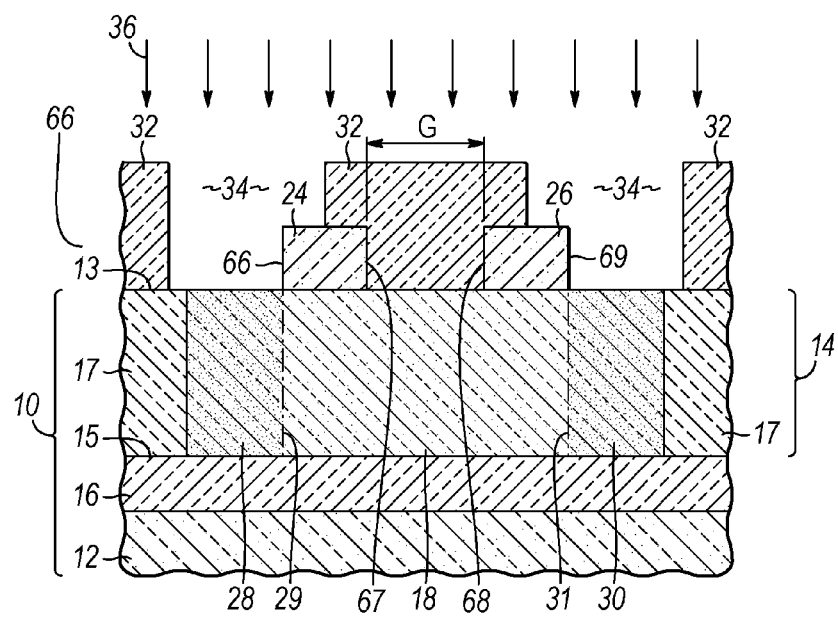

With reference to FIGS. 3A, 3B in which like reference numerals refer to like features in FIGS. 2A-2C and at a subsequent fabrication stage, doped regions 28, 30 of the same conductivity type as the base doping are formed in the device region 18 of the SOI layer 14. An ion-implantation mask 32 is applied and patterned with windows 34 that expose strips at opposite lateral edges of the device region 18.

The ion-implantation mask 32 overlaps with the mask structures 24, 26 to cover the gap, G, between the mask structures 24, 26. The ion-implantation mask 32 may be formed of a resist layer that is applied and photolithographically patterned in a conventional manner. Ions, as indicated by the single-headed arrows 36, are implanted into the SOI layer 14 to form the doped regions 28, 30. The thickness and stopping power of the ion-implantation mask 32 are selected to provide the needed stopping of ions 36 outside of the windows 34.

The mask structures 24, 26 self-align interior edges 29, 31 of the doped regions 28, 30 during implantation and assist in defining a boundary for the doped regions 28, 30. The doped regions 28, 30 include exterior edges defined by the outer perimeter of the device region 18 at the border with the lateral isolation structure 17. The doped regions 28, 30 extend in depth to the planar interface of the SOI layer 14 with the buried dielectric layer 16. After ions 36 are implanted, the ion-implantation mask 32 is removed from the top of SOI layer 14 by, for example, oxygen plasma ashing or solvent stripping.

The dopant species of the ions 36 is chosen to dope the doped regions 28, 30 with the same conductivity type as the base doping of the device region 18 but at a higher dopant concentration. Multiple implantations may be used to form the doped regions 28, 30, and may be ultimately followed by an anneal, such as a rapid thermal anneal, to electrically activate the implanted impurity species and alleviate implantation damage. The introduction of the dopant into device region 18 to form doped regions 28, 30 alters the electrical properties of the constituent semiconductor material and, due to the heavy doping, increases the conductivity (e.g., decreases the resistivity) of the constituent semiconductor material by at least an order of magnitude in comparison with the base doping.

Figure 4A:
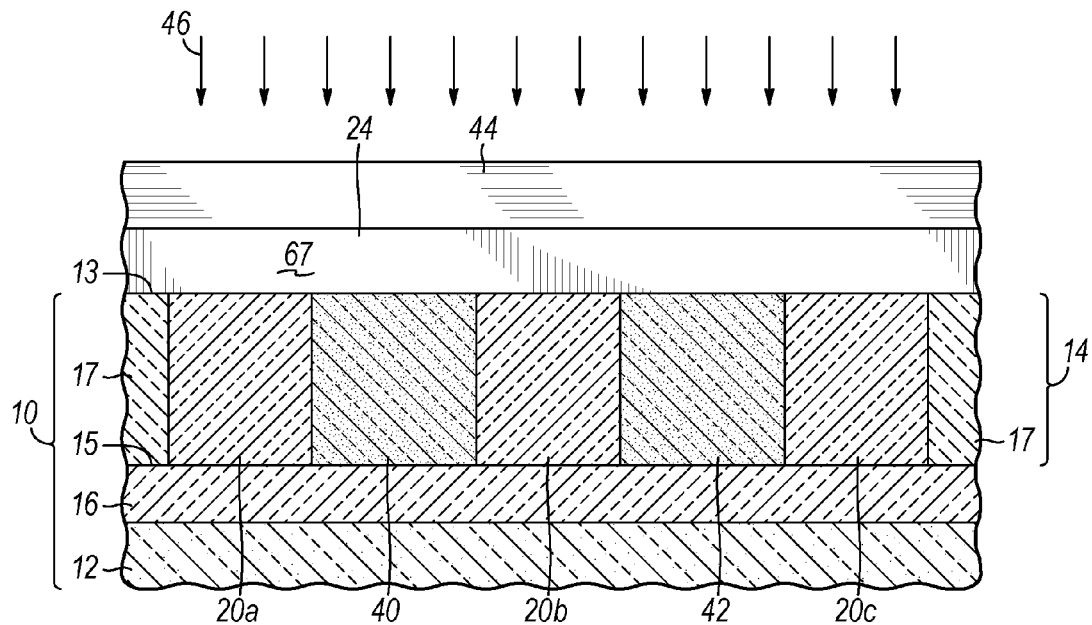
FIGS. 4A and 4B are cross-sectional views similar to FIGS. 3A and 3B, respectively, at a subsequent fabrication stage of the processing method.
Figure 4B:
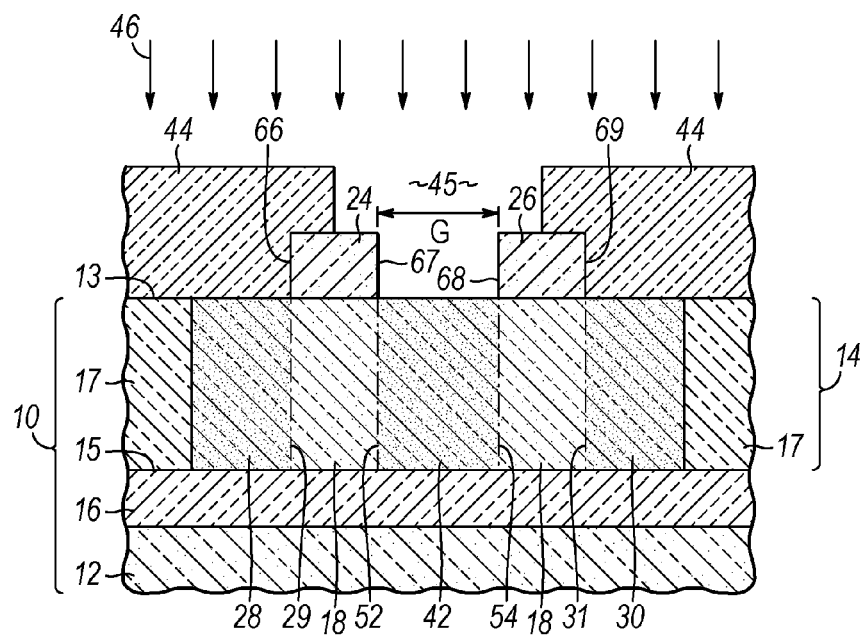

With reference to FIGS. 4A, 4B in which like reference numerals refer to like features in FIGS. 3A, 3B and at a subsequent fabrication stage, doped regions 40, 42 are centrally formed in the device region 18 of the SOI layer 14. A mask 44 is applied that overlaps with the mask structures 24, 26 and is patterned with a window 45 that exposes the gap, G, between the mask structures 24, 26. The ion-implantation mask 44 may be formed of a resist layer that is applied and photolithographically patterned in a conventional manner. Ions, as indicated by the single-headed arrows 46, are implanted into the SOI layer 14 to form the doped regions 40, 42. The thickness and stopping power of the ion-implantation mask 44 are selected to stop the ions 46 and thereby prevent the ions 46 from reaching the SOI layer 14 outside of the window 45.

The doped regions 40, 42 may extend in depth from the top surface 13 of the SOI layer 14 to the planar interface of the SOI layer 14 with the top surface 15 of buried dielectric layer 16. The doped regions 40, 42 are comprised of semiconductor material of the SOI layer 14 in the device region 18 that is doped with an opposite conductivity type in comparison with the doped regions 28, 30 and the base doping of the device region 18. The dopant species of the ions 46 is chosen to dope the doped regions 40, 42 with the appropriate conductivity type. Multiple implantations may be used to form the doped regions 40, 42 and may be ultimately followed by an activation step such as thermal annealing or rapid thermal annealing. The introduction of the dopant into device region 18 to form doped regions 40, 42 alters the electrical properties of the constituent semiconductor material, changes the conductivity type of the doped regions 40, 42 in comparison with the base doping, and, due to the heavy doping, increases the conductivity (e.g., decreases the resistivity) of the constituent semiconductor material by at least an order of magnitude in comparison with the base doping.

In a representative embodiment, the doped regions 40, 42 may be comprised of heavily-doped p-type (p$^+$) semiconductor material and the doped regions 28, 30 may be comprised of heavily-doped n-type (n$^+$) semiconductor material. Specifically, doped regions 40, 42 may be formed by implanting ions 46 of a p-type dopant such as B, Al, or Ga, and doped regions 28, 30 may be formed by implanting ions 36 of an n-type dopant such as P, As, or Sb.

The ions 36, 46 implanted into device region 18 to form the doped regions 28, 30, 40, 42 may originate from an NFET or PFET source/drain implantation. For example, the doped regions 40, 42 may be formed during PFET source/drain implantation of a p-type species and the doped regions 28, 30 may be formed during an NFET source/drain implantation of an n-type species.

With reference to FIGS. 5, 5A, 5B, 5C, 5D in which like reference numerals refer to like features in FIGS. 4A, 4B and at a subsequent fabrication stage, the ion-implantation mask 44 is removed from the top of SOI layer 14 by, for example, oxygen plasma ashing or solvent stripping after the implantation of ions 46 is completed.

Doped regions 48a, 49a, 50a and doped regions 48b, 49b, 50b, which are masked during the implantation of ions 36 forming the doped regions 28, 30 and during the implantation of ions 46 forming doped regions 40, 42, retain the base doping of the device region 18 and are oppositely doped in comparison with doped regions 28, 30. The base doping of the device region 18 is lightly-doped n-type so that the doped regions 48a,b, 49a,b, 50a,b are lightly-doped n-type. Doped regions 48a, 49a, 50a and doped regions 48b, 49b, 50b have the same conductivity type as the doped regions 28, 30. Doped region 49a is disposed laterally between the doped regions 48a, 50a and the doped region 28 in a lateral direction orthogonal to the widths $W_1$, $W_2$, $W_3$. Doped region 49b is disposed laterally between the doped regions 48b, 50b and the doped region 28 in a lateral direction orthogonal to the widths $W_1$, $W_2$, $W_3$.

A p-n junction 52 is defined along a two-dimensional interface between doped regions 40, 42 and doped region 48a, 50a of opposite conductivity type. During implantation of ions 46, side edge 67 of mask structure 24 vertically self-aligns an interior edge of the doped region 48 with doped region 48a and an interior edge of the doped region 42 with doped region 50a to define the p-n junction 52. A p-n junction 54 is defined along a two-dimensional interface between doped regions 40, 42 and doped regions 48b, 50b of opposite conductivity type. During implantation of ions 46, side edge 68 of mask structure 26 vertically self-aligns an interior edge of the doped region 40 with doped region 48b and an interior edge of the doped region 42 with doped region 50b to define the p-n junction 54. The doped regions 40, 42 include other interior edges defined by the intersection with the edges of the dielectric regions 20a, 20b, 20c.

The p-n junctions 52, 54 represent respective planes across which the concentration of acceptors is equal to the concentration of donors. The lateral separation between the p-n junctions 52, 54 is determined by the dimension of the gap, G, between the mask structures 24, 26.

The doped regions 28, 30, 40, 42, 48a,b, 49a,b, 50a,b of semiconductor material of the device region 18 of SOI layer 14 cooperate to form a lateral diode 56 with p-n junctions 52, 54. In the representative embodiment, the doped regions 40, 42 are p$^+$-doped to form an anode of the lateral diode 56, and the doped regions 28, 30 are n$^+$-doped and doped regions 48a,b, 49a,b, 50a,b are n$^-$-doped to collectively form a cathode of the lateral diode 56. Alternatively, doped regions 40, 42 may be n$^+$-doped, and the doped regions 28, 30 may be p$^+$-doped and doped regions 48a,b, 49a,b, 50a,b may be p$^-$-doped.

A local interconnect level, or contact (CA) level may be formed to provide local contacts and interconnections with the anode and cathode of the lateral diode 56. The CA level includes a dielectric layer, a set of contact plugs that penetrate through the dielectric layer to land on the doped regions 28, 30, and a separate set of contact plugs that penetrate through the dielectric layer to land on the doped regions 40, 42. Silicide may be formed on top surfaces of the doped regions 28, 30, 40, 42 to provide ohmic contact surfaces and lower the sheet resistance of the anode and cathode. The contact plugs may permit the anode and cathode of the lateral diode 56 to be electrically coupled to other parts of the integrated circuit by providing an electrical connection between wires formed in higher metallization levels.

Standard back-end-of-line (BEOL) processing follows the formation of the lateral diode 56 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process is replicated to stack multiple wiring levels so that a multilevel, high density framework of conductive interconnections is formed. Damascene processes and materials used in damascene processes are understood by a person having ordinary skill in the art.

The dielectric regions 20a, 20b, 20c extend across the strip of the active region that includes doped regions 40, 42 from lightly-doped region 48a,b to lightly-doped region 50a,b. The dielectric regions 20a, 20b, 20c encroach a short distance into the adjacent lightly-doped regions 48a,b, 50a,b such that the physical and continuity electrical continuity of the p-n junctions 52, 54 are interrupted at the location of each of the dielectric regions 20a, 20b, 20c.

Adjacent pairs of dielectric regions 20a, 20b, 20c are separated with a spacing, S, determined by a feature pitch. The number and feature pitch of the dielectric regions 20a, 20b, 20c are design parameters selected when the dielectric regions 20a, 20b, 20c are formed in the SOI layer 14, and may be selected to optimize current spreading for a given junction capacitance and heat dissipation. Each of the dielectric regions 20a, 20b, 20c has a width $W_1$ and, in the representative embodiment, the dielectric regions 20a, 20b, 20c are assumed to have equals widths $W_1$. Alternatively, the individual widths $W_1$ may differ among different dielectric regions 20a, 20b, 20c.

The p-n junctions 52, 54 only exist over areas of direct contact between the n-type and p-type semiconductor materials of the doped regions 40, 42 and doped regions 48a,b, 50a,b. Each of the p-n junctions 52, 54 is parsed or partitioned by the dielectric regions 20a, 20b, 20c into multiple sections with each individual section having a width equal to the widths $W_2$ of the doped regions 48a,b, 50a,b. The widths $W_2$ of the doped regions 48a,b, 50a,b are the limiting factor in the determination of the effective junction width. Because each of the p-n junctions 52, 54 has multiple sections, the effective width of each of the p-n junctions 52, 54 for the device structure is numerically equal in the aggregate to the sum of the widths $W_2$ of each constituent section. As best shown in FIG. 5C, the total width of p-n junction 52 is given by the sum of the widths $W_2$ for junction sections 52a, 52b. Junction 54 has similar junction sections (not shown) that are summed to determine a junction width.

Each of the p-n junctions 52, 54 has a height, $H_1$, which is measured from the top surface 13 of SOI layer 14 to the top surface 15 of the buried dielectric layer 16 in the representative embodiment. As a result, each of the p-n junctions 52, 54 has a total area across which the numbers of acceptors and donors are equal and that total area is numerically equal to the product of the width $W_2$ and height $H_1$ summed over all junction sections. For example, the total area of p-n junction 52 is given by the sum of the individual areas of the junction sections 52a, 52b.

The doped regions 40, 42, which are segmented by the dielectric regions 20a, 20b, 20c, are also characterized by individual sections having the width $W_2$ of the junction sections. In the representative embodiment, the dielectric regions 20a, 20b, 20c do not laterally project or otherwise intrude into the doped regions 28, 30 of the cathode. In addition, the dielectric regions 20a, 20b, 20c do not laterally project or otherwise intrude into the doped regions 49a,b of the cathode. Hence, each of the doped regions 49a and 49b is continuous and has a width $W_3$ that is greater than the sum of the widths $W_2$ for the junction sections. The lateral diode 56 presents an asymmetrical head-neck-body configuration for the anode and cathode. Each of the doped regions 28, 30 is also continuous and is characterized by the width $W_3$.

Mask structure 24 has side edges 66, 67 that are each aligned with the widths $W_1$, $W_2$, $W_3$ and positioned in a spaced relationship relative to each other. The separation between the side edges 66, 67 is given by the dimension of the mask structure 24 in a direction orthogonal to the widths $W_1$, $W_2$, $W_3$. Side edge 67 of the mask structure 24 is vertically aligned with the p-n junction 52 formed in the SOI layer 14

Similarly, mask structure 26 has side edges 68, 69 that are each aligned with the widths $W_1$, $W_2$, $W_3$ and positioned in a spaced relationship relative to each other. The separation between the side edges 68, 69 is given by the dimension of the mask structure 26 in a direction orthogonal to the widths $W_1$, $W_2$, $W_3$. Side edge 68 of the mask structure 26 is vertically aligned with the p-n junction 54 formed in the SOI layer 14.

The side edges 58, 60 of each of the dielectric regions 20a, 20b, 20c are aligned with the widths $W_1$, $W_2$, $W_3$ and are separated by the dimension of each dielectric region 20a, 20b, 20c in a direction orthogonal to the widths $W_1$, $W_2$, $W_3$. The mask structure 24 overlaps with the respective side edge 58 of each of the dielectric regions 20a, 20b, 20c so that side edge 58 is between the side edges 66, 67 of the mask structure 24. The mask structure 26 overlaps with the respective side edge 60 of each of the dielectric regions 20a, 20b, 20c so that side edge 60 is between the side edges 68, 69 of the mask structure 26. As a result of the spatial arrangement, the dielectric regions 20a, 20b, 20c bridge or span across the space from mask structure 24 to mask structure 26. The doped region 28 of the cathode is separated from the side edge 58 of each of the dielectric regions 20a, 20b, 20c by at least the doped region 49a of the cathode. The doped region 30 of the cathode is separated from the side edge 60 of each of the dielectric regions 20a, 20b, 20c by at least the doped region 49b of the cathode. Width $W_3$ is evaluated or measured across doped region 49a at a location (or along a line) between the side edges 58 of the dielectric regions 20a, 20b, 20c and doped region 28 and across doped region 49b at a location (or along a line) between the side edges 60 of the dielectric regions 20a, 20b, 20c and doped region 28. This location for evaluating width $W_3$ is spaced laterally from the p-n junctions 52, 54.

Alternatively, width $W_3$ may evaluated in the doped regions 28, 30 at a location spaced laterally from the p-n junctions 52, 54.

At the locations of the encroaching dielectric regions 20a, 20b, 20c, the n-type and p-type semiconductor materials of the doped regions 40, 42 and doped regions 48a,b, 50a,b lack a contacting relationship. In the absence of a potential barrier across these non-contacting locations, each of the p-n junctions 52, 54 is segmented into discrete sections. Instead, the doped regions 49a,b contact the side edges 58, 60 of the dielectric regions 20a, 20b, 20c.

In the representative embodiment, the number and pitch of the dielectric regions 20a, 20b, 20c are selected such that the width $W_1$ of each of the dielectric regions 20a, 20b, 20c is approximately equal to the width $W_2$ of the portion of each of the p-n junctions 52, 54 between adjacent pairs of dielectric regions 20a, 20b, 20c. However, the number and pitch of the dielectric regions 20a, 20b, 20c may vary. In addition, the width $W_3$ of the doped regions 28, 30 may be equal to a width of the device region 18.

The effective width of the p-n junctions 52, 54 determines a junction area and, thereby, the junction capacitance of the lateral diode 56. The introduction of the dielectric regions 20a, 20b, 20c as insulating structures interrupting the electrical continuity of the p-n junctions 52, 54 effectively reduces the area of the p-n junctions 52, 54. However, the dielectric regions 20a, 20b, 20c displace only a small volume of the semiconductor material of the device region 18 of SOI layer 14. In particular, the dielectric regions 20a, 20b, 20c displace a small volume of the device region between the heavily-doped regions 40, 42 and the opposite side edges 58, 60 do not intrude into the heavily-doped regions 28, 30.

In one embodiment, the lateral diode 56 may be wired to functionally supply ESD protection for circuitry fabricated using other regions of the SOI substrate 10. The doped regions 40, 42, which form the anode of the lateral diode 56, are connected with an input output (I/O) pad through the metallization levels of the BEOL interconnect structure. The doped regions 28, 30, which form a cathode of the lateral diode 56, are connected with a positive power supply voltage $V_{DD}$, so that the I/O pad is selectively coupled to the positive voltage supply $V_{DD}$ through the lateral diode 56. In operation, the lateral diode 56 provides an ESD current path for a positive-voltage ESD pulse from the I/O pad to the positive voltage supply $V_{DD}$. Under normal operating conditions, the lateral diode 56 is reversed biased, so that the lateral diode 56 is in an off (i.e., non-conductive) state. An ESD pulse may cause lateral diode 56 to become forward biased, at which point it will begin conducting current to the positive power supply, clamping the voltage of I/O pad to $V_{DD}$ plus the forward bias of the lateral diode 56.

During an ESD event, the heavily-doped regions 28, 30, 40, 42 contribute to the ability of the device region 18 to dissipate heat, which in turn is highly determinative of the current handling ability of the lateral diode 56. In comparison with bulk technologies, the thin layer thickness of the SOI layer 14 and the intervening buried dielectric layer 16 reduce the ability of the device region 18 to dissipate heat. The current capacity—or failure current ($I_{FAIL}$)—of the lateral diode 56 may be determined by how much energy can be absorbed without incurring damage from an excessive temperature increase, which in turn depends largely on the volume of the anode and cathode regions.

The dielectric regions 20a, 20b, 20c minimize the junction capacitance with a minimal penalty to heat dissipation. The dielectric regions 20a, 20b, 20c operate to maximize the failure current per unit capacitance while minimizing the on-resistance ($R_{ON}$) of the lateral diode 56 per unit capacitance. Hence, the lateral diode 56 exhibits improved $I_{FAIL}/C_J$ and $R_{ON}/C_J$ ratios for a given junction capacitance by providing improved heat dissipation and on resistance as compared to a conventional diode structure with an equivalent p-n junction area.

Alternatively, the cathode of the lateral diode 56 may be electrically coupled with the I/O pad and the anode of the lateral diode 56 electrically coupled to a negative supply voltage, $V_{SS}$. With this connection, a negative voltage ESD pulse will cause lateral diode 56 to become forward biased so that the ESD currents are shunted to the negative voltage supply, clamping the I/O pad voltage at $V_{SS}$ minus the forward bias of the lateral diode 56.

The various embodiments of the lateral diode 56 described herein may also comprise an NPN or a PNP of a semiconductor-controlled rectifier (SCR). An SCR is a four-layer solid state device structure with four layers of alternating p-type and n-type semiconductor materials and is used to control current. An SCR may be used in an ESD application similar to the lateral diode 56, although the embodiments of the invention are not so limited.

Figure 5D:
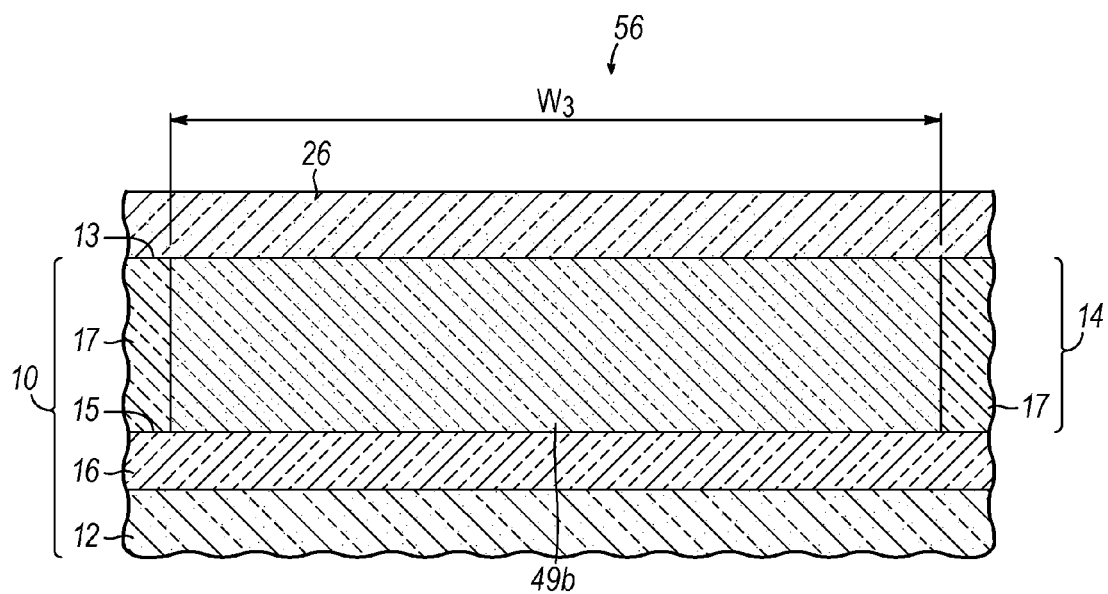
FIG. 5D is a cross-sectional view taken generally along line 5D-5D of FIG. 5.
Figure 5:
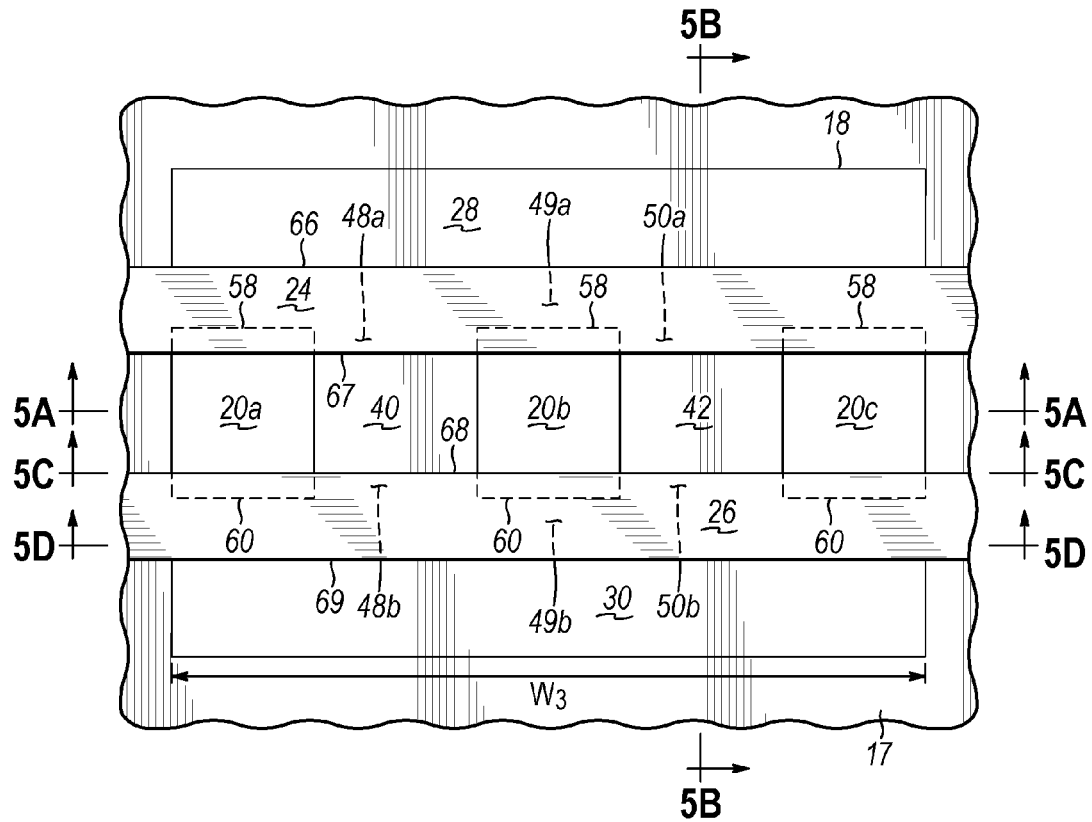
FIG. 5 is a diagrammatic top view of the substrate portion at a fabrication stage of the processing method subsequent to FIGS. 4A, 4B.
Figure 5A:
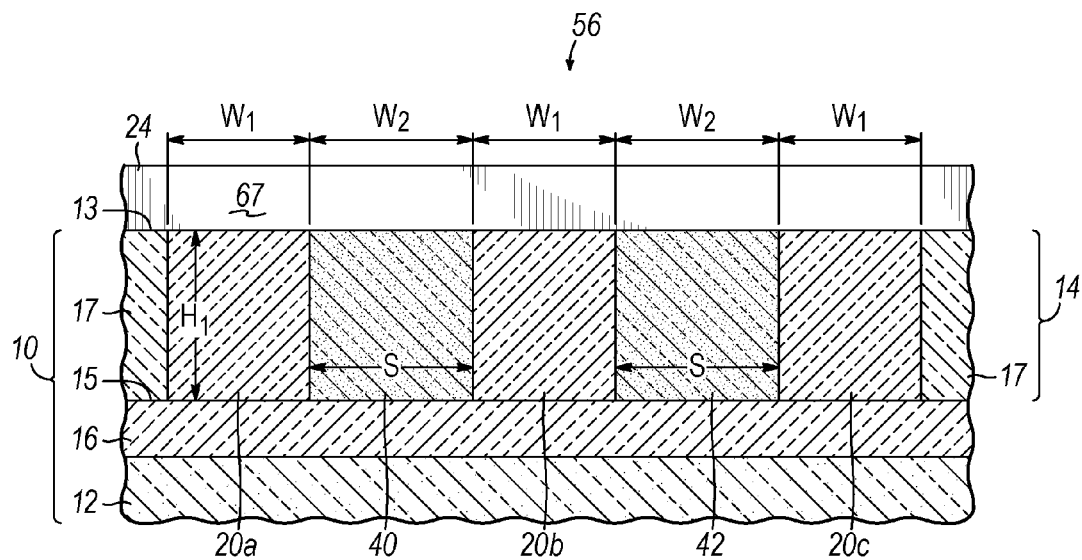
FIG. 5A is a cross-sectional view taken generally along line 5A-5A of FIG. 5.
Figure 5B:
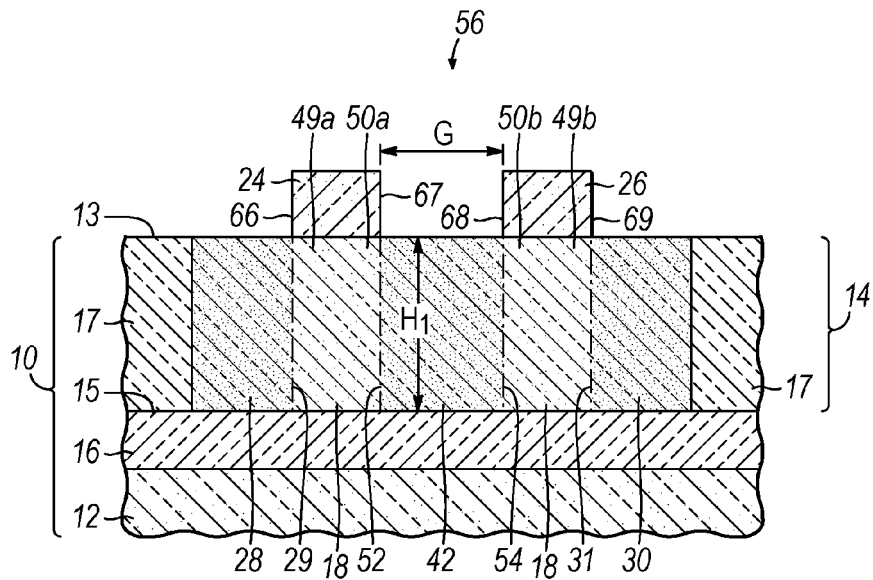
FIG. 5B is a cross-sectional view taken generally along line 5B-5B of FIG. 5.
Figure 5C:
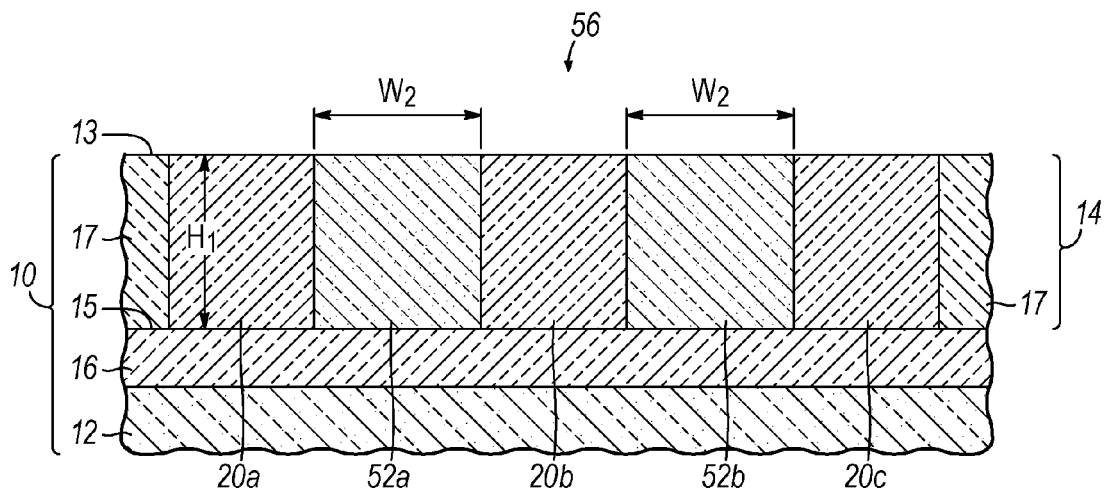
FIG. 5C is a cross-sectional view taken generally along line 5C-5C of FIG. 5.
Figure 6:
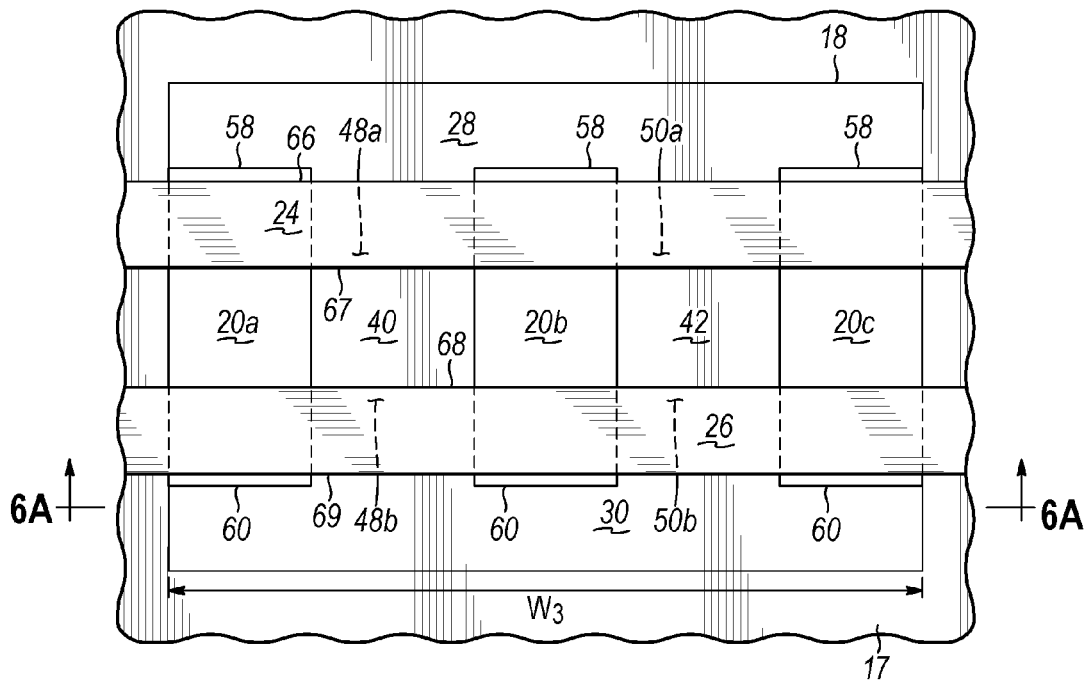
FIG. 6 is a diagrammatic top view of a portion of a substrate in accordance with an alternative embodiment of the invention.
Figure 6A:
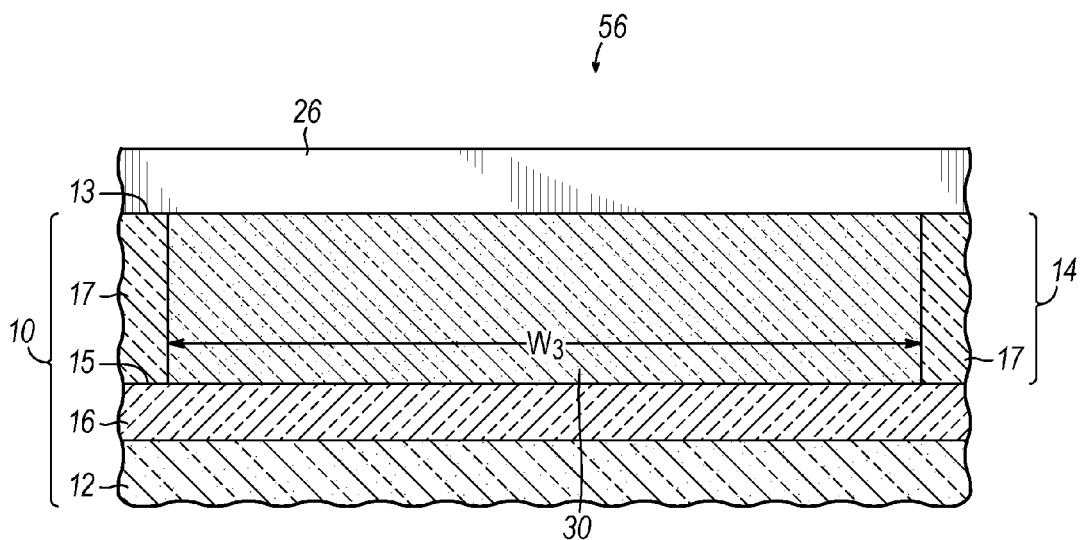
FIG. 6A is a cross-sectional view taken generally along line 6A-6A of FIG. 6.

With reference to FIGS. 6, 6A in which like reference numerals refer to like features in FIGS. 5, 5A-5D and in accordance with an alternative embodiment of the invention, the dielectric regions 20a, 20b, 20c may be enlarged by increasing a dimension of the dielectric regions 20a, 20b, 20c in a direction orthogonal to the widths $W_1$, $W_2$, $W_3$. In the representative embodiment, the enlargement is symmetrical about the midplane of the doped regions 40, 42 forming the anode of the lateral diode 56. The enlargement, which is executed when the dielectric regions 20a, 20b, 20c are formed in connection with FIGS. 1, 1A, operates to eliminate the lightly-doped regions 49a, 49b of the cathode of the lateral diode 56. The dielectric regions 20a, 20b, 20c protrude into the doped regions 28, 30, which form portions of the cathode of the lateral diode 56. However, the dielectric regions 20a, 20b, 20c do not extend to the perimeter of the device region 18 so that the doped regions 28, are at least partially continuous and unbroken by the dielectric regions 20a, 20b, 20c. The width, $W_3$, of the cathode is assessed at a location in the doped regions 28, 30 that is spaced laterally from the p-n junctions 52, 54. The doped regions 40, 42 constituting the anode for this embodiment of the lateral diode 56 are depicted in FIG. 5A, the p-n junctions 52, 54 for this embodiment of the lateral diode 56 are depicted in FIG. 5B, and the sections 52a, 52b of the p-n junction 52 for this embodiment of the lateral diode 56 are depicted in FIG. 5C.

Figure 7:
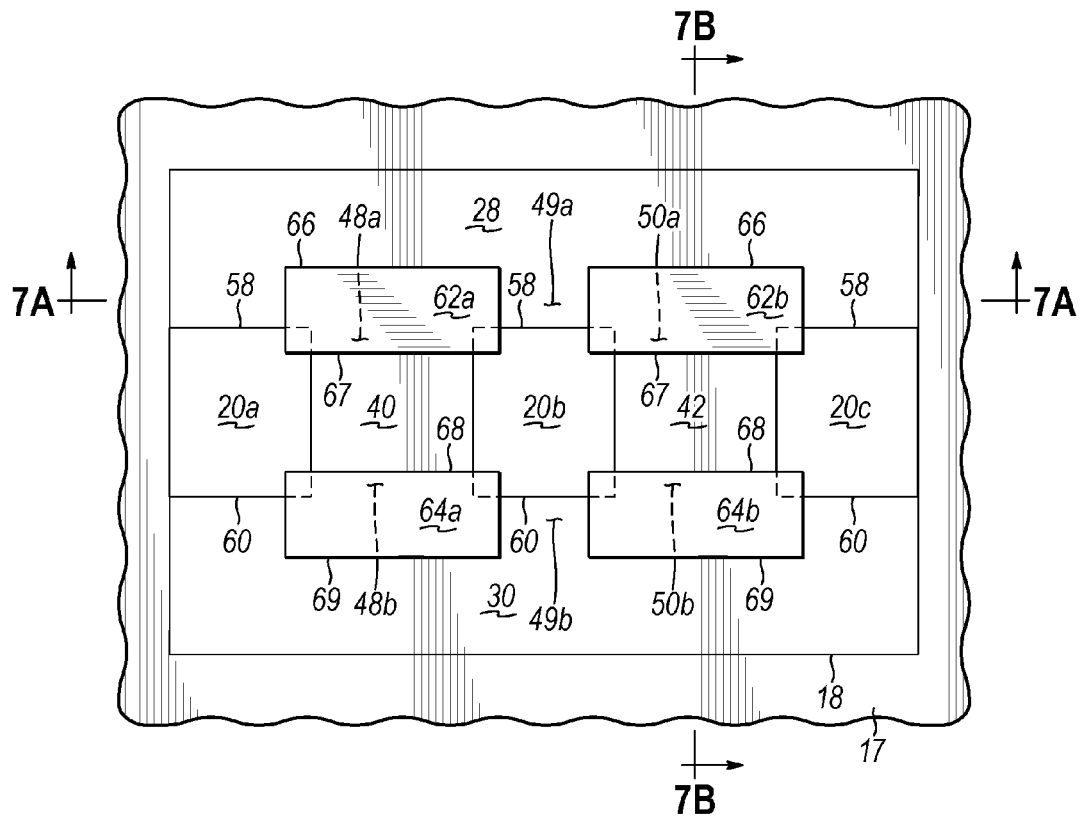
FIG. 7 is a diagrammatic top view of a portion of a substrate in accordance with an alternative embodiment of the invention.
Figure 7A:
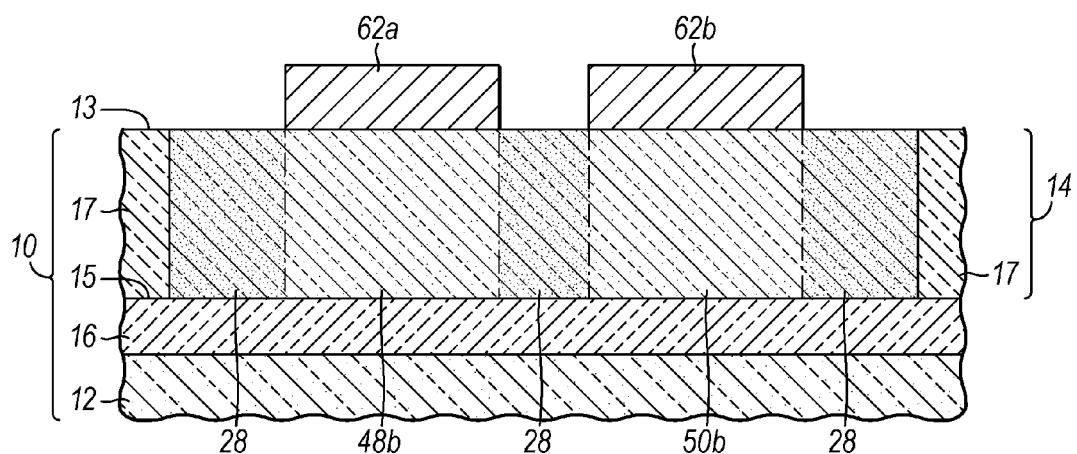
FIG. 7A is a cross-sectional view taken generally along line 7A-7A of FIG. 7.
Figure 7B:
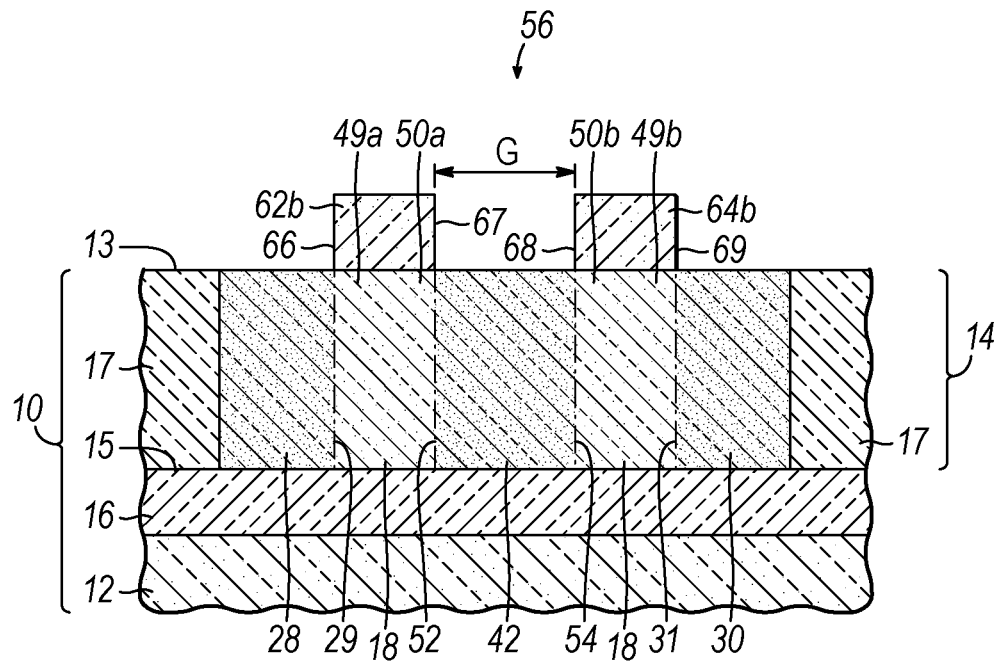
FIG. 7B is a cross-sectional view taken generally along line 7B-7B of FIG. 7.

With reference to FIGS. 7, 7A, 7B in which like reference numerals refer to like features in FIGS. 5, 5A-5D and in accordance with an alternative embodiment of the invention, mask structures 62a, 62b and mask structures 64a, 64b are formed that mask a smaller surface area of the device region 18 of SOI layer 14. The mask structures 62a, 62b, 64a, 64b may be formed from the same materials and in a similar manner to the mask structures 24, 26 (FIGS. 5, 5A-5D). Unlike the mask structures 24, 26, however, the mask structures 62a, 62b, 64a, 64b are segmented into an aligned set of discontinuous strips. As a result, the side edges of the dielectric regions 20a, 20b, 20c and the adjacent portions of device region 18 are unmasked.

Because of the reduced masking by the mask structures 62a, 62b, 64a, 64b during implantation in comparison with mask structures 24, 26, the ions 36 (FIGS. 3A, 3B) dope a larger volume of the device region 18 to form doped regions 28, 30 while the effective width and area of the p-n junctions 52, 54 remains unchanged. The doped regions 40, 42 constituting the anode for this embodiment of the lateral diode 56 are depicted in FIG. 5A, the p-n junctions 52, 54 for this embodiment of the lateral diode 56 are depicted in FIG. 5B, and the sections 52a, 52b of the p-n junction 52 for this embodiment of the lateral diode 56 are depicted in FIG. 5C.

The strip segments of the mask structure 62a, 62b only partially overlap the side edges 58 of the dielectric regions 20a, 20b, 20c so that region 28 of the cathode is coextensive with the side edges 58 of the dielectric regions 20a, 20b, 20c. The strip segments of the mask structure 64a, 64b only partially overlap the side edges 60 of the dielectric regions 20a, 20b, 20c so that region 30 of the cathode is coextensive with the side edges 60 of the dielectric regions 20a, 20b, 20c. These spatial relationships increase the volume of conductive material in the doped regions 28, 30.

The increased volume of conductive material in the doped regions 28, 30 may enhance the ability of the lateral diode 56 to dissipate heat within the device region 18 in comparison with the lateral diode 56 in FIGS. 5, 5A-D. This may further improve current spreading and heat dissipation while providing nominally the same junction capacitance as the diode structure presented in FIGS. 5, 5A-5D, further improving the $I_{FAIL}/C_J$ and $R_{ON}/C_J$ metrics.

Figure 8B:
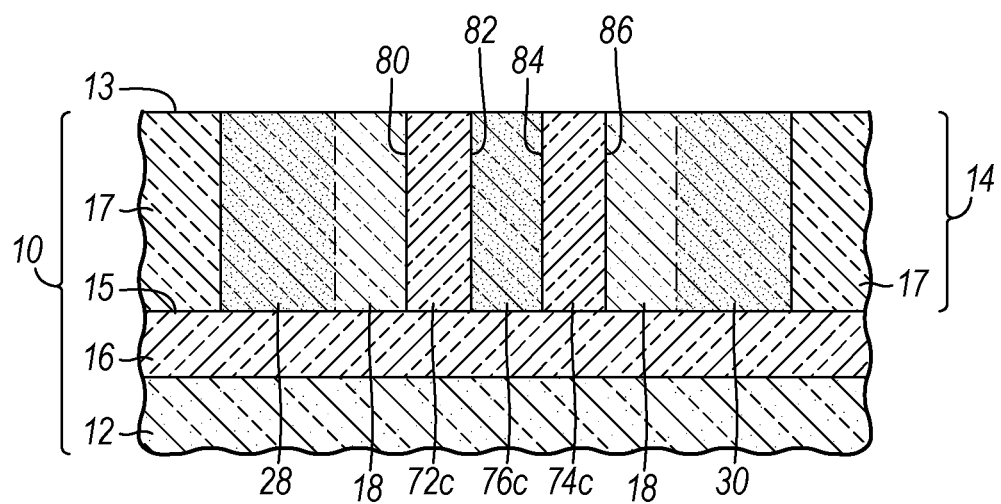
FIG. 8B is a cross-sectional view taken generally along line 8B-8B of FIG. 8.
Figure 8:
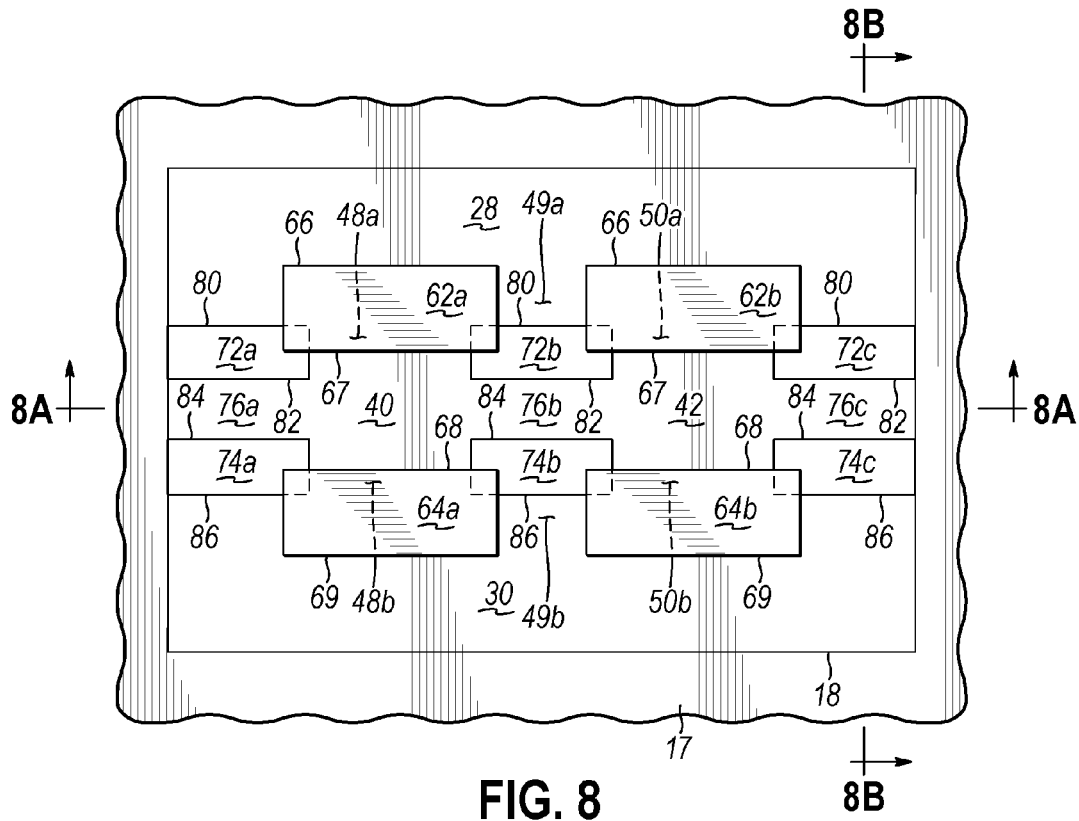
FIG. 8 is a diagrammatic top view of a portion of a substrate in accordance with an alternative embodiment of the invention.
Figure 8A:
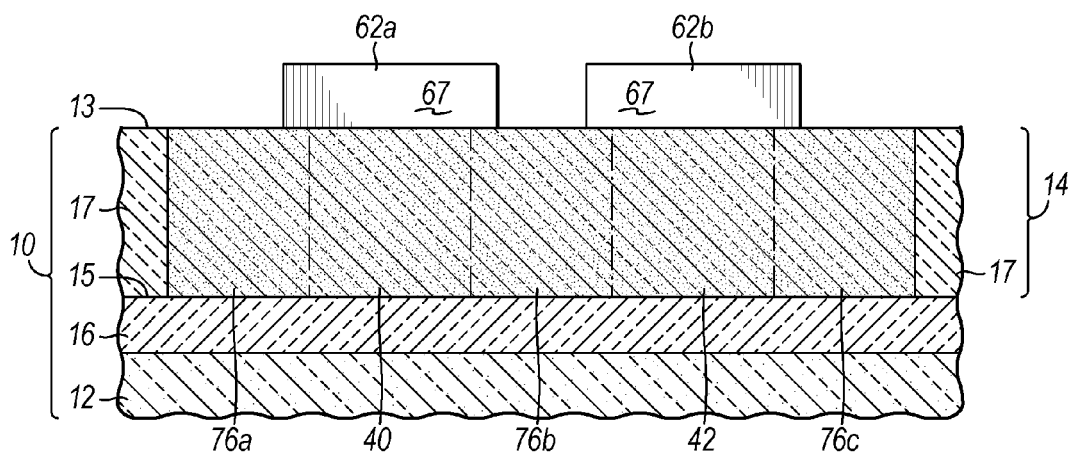
FIG. 8A is a cross-sectional view taken generally along line 8A-8A of FIG. 8.

With reference to FIGS. 8, 8A, 8B in which like reference numerals refer to like features in FIGS. 5, 5A-5D and in accordance with an alternative embodiment of the invention, a plurality of dielectric regions 72a, 72b, 72c and a plurality of dielectric regions 74a, 74b, 74c are formed in the SOI layer 14 as a replacement for, or modification to, the dielectric regions 20a, 20b, 20c. In the representative embodiment, the dielectric regions 72a, 72b, 72c may be arranged in a row that is aligned along the p-n junction 52 and the dielectric regions 74a, 74b, 74c may be arranged in a row that is aligned along the p-n junction 54. The row of dielectric regions 74a, 74b, 74c is spaced laterally from the row of dielectric regions 72a, 72b, 72c. The dielectric regions 72a, 72b, 72c and dielectric regions 74a, 74b, 74c may be formed using STI techniques as described above (FIG. 1, 1A) for dielectric regions 20a, 20b, 20c.

Each of the dielectric regions 72a, 72b, 72c has opposite side edges 80, 82 that are parallel and directionally aligned with widths $W_1$, $W_2$, $W_3$. Each of the dielectric regions 74a, 74b, 74c likewise has opposite side edges 84, 86 that are parallel and directionally aligned in a direction with widths $W_1$, $W_2$, $W_3$. The side edge 80 of each of the dielectric regions 72a, 72b, 72c borders the doped region 28. The side edge 86 of each of the dielectric regions 74a, 74b, 74c borders the doped region 30. Side edge 82 of each of the dielectric regions 72a, 72b, 72c is spaced laterally from the side edge 84 of each of the dielectric regions 74a, 74b, 74c such that doped regions 76a, 76b, 76c of the anode are disposed between the side edges 82, 84. The doped regions 76a, 76b, 76c seamlessly merge with the doped regions 40, 42 to define a continuous anode that is centrally located in the device region 18.

Because of the reduced masking during implantation, ions 46 (FIGS. 4A, 4B) dope a larger volume of the device region 18 to form additional doped regions 76a, 76b, 76c with the same conductivity type (e.g., p+ doped) as doped regions 48a,b, 50a,b while the area of each of the p-n junctions 52, 54 is still reduced commensurate with the reduction provided by dielectric regions 20a, 20b, 20c. The p-n junctions 52, 54 for this embodiment of the lateral diode 56 are depicted in FIG. 5B, the sections 52a, 52b of the p-n junction 52 for this embodiment of the lateral diode 56 are depicted in FIG. 5C, and the doped region 49a for this embodiment of the lateral diode 56 are depicted in FIG. 5D.

The increased volume of the device region 18 that is doped by ions 46 enhances the ability to dissipate heat within the device region 18. The effective increase in the dimensions of doped regions 40, 42 from the addition of doped regions 76a, 76b, 76c may further increase the heat dissipation of the lateral diode 56, resulting in a higher $I_{FAIL}$ without changing $C_J$.

The splitting of the dielectric regions is described in FIGS. 8, 8A, 8B in combination with the mask structures 62a, 62b, 64a, 64b, which are segmented versions of the mask structures 24, 26 (FIGS. 5, 5A-D). However, in another alternative embodiment, the splitting of the dielectric regions in FIGS. FIGS. 8, 8A, 8B may be employed in combination with the mask structures 24, 26.

Figure 9:
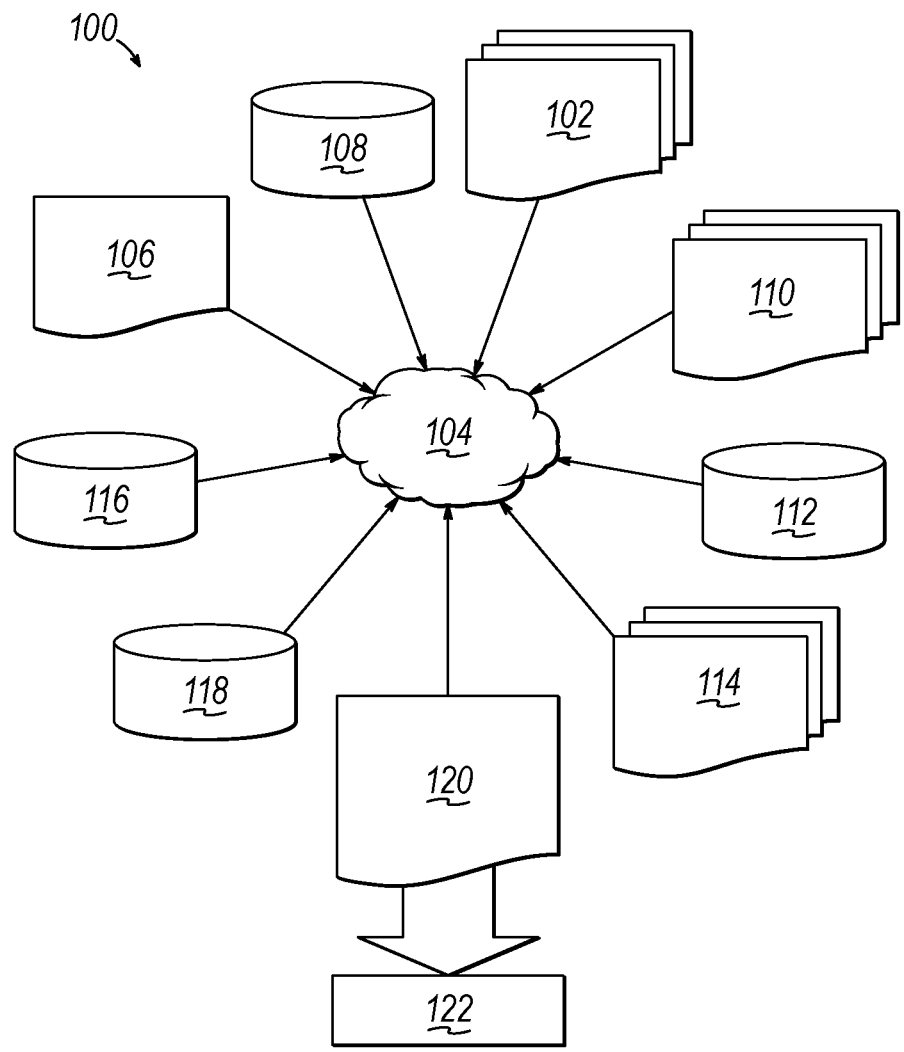
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 5, 5A, 5B, 5C, FIGS. 6, 6A, FIGS. 7, 7A, 7B, and FIGS. 8, 8A, 8B. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 5, 5A, 5B, 5C, FIGS. 6, 6A, FIGS. 7, 7A, 7B, and FIGS. 8, 8A, 8B. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 5, 5A, 5B, 5C, FIGS. 6, 6A, FIGS. 7, 7A, 7B, and FIGS. 8, 8A, 8B to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5, 5A, 5B, 5C, FIGS. 6, 6A, FIGS. 7, 7A, 7B, and FIGS. 8, 8A, 8B. In one embodiment, design structure 120 may comprise a compiled, executable HDL simulation model that functionally simulates the devices shown in FIGS. 5, 5A, 5B, 5C, FIGS. 6, 6A, FIGS. 7, 7A, 7B, and FIGS. 8, 8A, 8B.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 5, 5A, 5B, 5C, FIGS. 6, 6A, FIGS. 7, 7A, 7B, and FIGS. 8, 8A, 8B. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating a device structure in a semiconductor layer of a semiconductor-on-insulator (SOI) substrate, the method comprising:
    forming a first region of a first conductivity type and a first width in the semiconductor layer;
    forming a second region of a second conductivity type in the semiconductor layer, the second region arranged relative to the first region so that the second region is coextensive with the first region along a p-n junction; and
    forming at least one dielectric region in the semiconductor layer that partitions the p-n junction into a plurality of sections of individual widths that aggregately have a second width measured in a direction parallel to the first width and shorter than the first width of the first region measured at a location spaced laterally from the p-n junction.

2. The method of claim 1 wherein the first region is a cathode of the device structure and the second region is an anode of the device structure.

3. The method of claim 1 wherein the SOI substrate includes a buried dielectric layer and a handle wafer separated from the semiconductor layer by the buried dielectric layer, and the dielectric regions in the semiconductor layer extend from a top surface of the semiconductor layer to the buried dielectric layer.

4. The method of claim 3 further comprising:
    forming a first mask structure on the top surface of the semiconductor layer having a first side edge and a second side edge each aligned with the first and second widths,
    wherein the dielectric regions have a first side edge aligned with the first and second widths.

5. The method of claim 4 wherein forming the second region of the second conductivity type in the semiconductor layer comprises:
    implanting a first dopant into the semiconductor layer to form the second region,
    wherein the first mask structure covers the first region of the first region during the implantation of the first dopant, and the first side edge of the first mask structure is vertically aligned with the p-n junction.

6. The method of claim 4 further comprising:
   implanting a second dopant into the semiconductor layer to form a third region having the same conductivity type as the first region and a higher electrical conductivity than the first region,
   wherein the second side edge of the first mask structure defines a boundary between the first region and the third region, and the first and third regions comprise a cathode of the device structure and the second region is an anode of the device structure.

7. The method of claim 1 wherein the SOI substrate includes a buried dielectric layer and a handle wafer separated from the semiconductor layer by the buried dielectric layer, and the at least one dielectric region in the semiconductor layer extends from a top surface of the semiconductor layer to the buried dielectric layer.

8. The method of claim 7 further comprising:
   forming a first mask structure on the top surface of the semiconductor layer having a first side edge and a second side edge each aligned with the first and second widths,
   wherein the at least one dielectric region has a first side edge aligned with the first and second widths.

9. The method of claim 8 wherein forming the second region of the second conductivity type in the semiconductor layer comprises:
   implanting a first dopant into the semiconductor layer to form the second region,
   wherein the first mask structure covers the first region of the first region during the implantation of the first dopant, and the first side edge of the first mask structure is vertically aligned with the p-n junction.

10. The method of claim 8 wherein the first side edge of the at least one dielectric region is located between the first and second side edges of the first mask structure.

11. The method of claim 8 wherein the second mask structure completely overlaps the second side edge of the at least one dielectric region.

12. The method of claim 9 further comprising:
   forming a second mask structure on the top surface of the semiconductor layer that is oriented parallel with the first mask structure and spaced laterally from the first side edge of the first mask structure.

13. The method of claim 12 wherein the at least one dielectric region has a second side edge parallel to the first side edge of the at least one dielectric region, and the at least one dielectric region bridges from the first mask structure to the second mask structure.

14. The method of claim 12 wherein the at least one dielectric region has a second side edge parallel to the first side edge of the at least one dielectric region, and the second side edge of the at least one dielectric region is laterally between the first side edge of the first mask structure and the second mask structure such that a portion of the first region is disposed between the second side edge of the at least one dielectric region and the second mask structure.

15. The method of claim 8 further comprising:
   implanting a second dopant into the semiconductor layer to form a third region having the same conductivity type as the first region and a higher electrical conductivity than the first region,
   wherein the second side edge of the first mask structure defines a boundary between the first region and the third region.

16. The method of claim 15 wherein the first mask structure partially overlaps the first side edge of the at least one dielectric region so that a portion of the third region is coextensive with the first side edge of the at least one dielectric region.

17. The method of claim 15 wherein the first mask structure completely overlaps the first side edge of the at least one dielectric region so that the third region is separated from the first side edge of the at least one dielectric region by the first region of the cathode.

18. The method of claim 15 wherein the first and third regions comprise a cathode of the device structure and the second region is an anode of the device structure.

19. A method of fabricating a device structure in a semiconductor layer of a semiconductor-on-insulator (SOI) substrate, the method comprising:
   forming a first region of a first conductivity type and a first width in the semiconductor layer;
   forming a second region of a second conductivity type in the semiconductor layer, the second region arranged relative to the first region so that the second region is coextensive with the first region along a p-n junction; and
   forming a plurality of dielectric regions in the semiconductor layer that partition the p-n junction into a plurality of sections of individual widths that aggregately have a second width measured in a direction parallel to the first width and shorter than the first width of the first region measured at a location spaced laterally from the p-n junction.

20. The method of claim 19 wherein the first region is a cathode of the device structure and the second region is an anode of the device structure.

* * * * *